United States Patent [19]

Schink et al.

[11] 4,444,559
[45] Apr. 24, 1984

[54] PROCESS AND APPARATUS FOR UNSOLDERING SOLDER BONDED SEMICONDUCTOR DEVICES

[75] Inventors: Karl Schink, Wappingers Falls; Herbert Wenskus, Hopewell Junction, both of N.Y.

[73] Assignee: International Business Machines Corporation, Armonk, N.Y.

[21] Appl. No.: 392,905

[22] Filed: Jun. 28, 1982

[51] Int. Cl.³ .............................................. F24J 3/00
[52] U.S. Cl. ...................................... 432/226; 432/9; 432/10
[58] Field of Search ..................... 432/10, 13, 19, 62, 432/184, 225, 226

[56] References Cited

U.S. PATENT DOCUMENTS

| | | | |
|---|---|---|---|
| 3,389,896 | 6/1968 | Wilcox et al. | 432/9 |
| 3,620,513 | 11/1971 | Wernicke | 432/10 |
| 3,761,550 | 9/1973 | Seefluth | 432/10 |
| 4,014,640 | 3/1977 | Emery et al. | 432/10 |
| 4,212,629 | 7/1980 | Nagasaka et al. | 432/226 |
| 4,352,659 | 10/1982 | Salmela et al. | 432/10 |

*Primary Examiner*—Henry C. Yuen
*Attorney, Agent, or Firm*—Wolmar J. Stoffel

[57] ABSTRACT

An apparatus for removing solder bonded devices from a substrate which includes a hollow housing element having an open end with a seating portion adapted to engage the flat backside of a semiconductor device, an inlet for admitting heated gases to the interior of the housing, and an outlet for the heated gases, a baffle within the housing having an end portion recessed from the seating portion of the housing wherein the baffle directs heated gas downwardly against the backside of the device when in engagement with the seating portion of the housing, and a clamping means to secure a semiconductor device in seated relation on the seating portion.

A rework method for removing a solder bonded semiconductor device from a ceramic substrate leaving only a coating of solder on the pad site sufficient to solder bond another device without the need for additional pad site preparation which includes the steps of preheating the substrate and solder bonded devices to a temperature not greater than 100° C. less than the melting point of the solder of the solder bonds, selectively directing a constrained stream of heated inert gas to the backside of the device to quickly raise the temperature of the solder bonds above the melting point of the solder, and lifting the device from the substrate before the heat applied by the heated gas significantly heats the top of the substrate above the pre-heated temperature.

4 Claims, 2 Drawing Figures

PROCESS AND APPARATUS FOR UNSOLDERING SOLDER BONDED SEMICONDUCTOR DEVICES

DESCRIPTION

1. Technical Field

This invention relates to a process and apparatus for unsoldering semiconductor devices that have been solder bonded to terminal pads of a substrate.

The present trends in microelectronics towards large scale integration require the use of semiconductor packages that interconnect and support a plurality of semiconductor devices. Such a package can consist, for example, of a multi-layer ceramic substrate with many semiconductor devices solder bonded to interconnection metallurgy in the substrate. Such a package is described and claimed in U.S Pat. No. 4,302,625.

When this type of multiple semiconductor device module is used in mass production, especially for high performance computers, the need for replacing one or more devices may arise if the latter has been found defective. The probability of this need increases as the number of devices contained in the module increases. In other words, the need is for obtaining a method for removing the defective devices from a given site, preparing the site for a new device and subsequently joining the new device. Examples of the background technique related to the removal of the devices by thermal methods are given in IBM Technical Disclosure Bulletin in the articles "Use of a Heated Jet to Remove a Silicon Chip Soldered to a Substrate", Vol. 20 No. 9 Feb. 1978 P. 3725, and "Inverted Hot Gas Selected Chip Removal" Vol. 21, No. 9, Feb. 1979 P. 3592. However, the most difficult task is to re-condition the solder pads on the substrate after the device has been removed. This normally consists of eliminating the solder partially but not entirely at the pad site. It is desirable that such a method be rapid, simple, and of low cost. It must not affect the adjacent devices or damage the metallurgy network present on the substrate surface, or produce solder runs that might result in undesirable short circuits between the conductor stripes or pads.

The removal of solder bonded devices with known conventional device removal techniques leaves a great deal of solder on the pad of the substrate. The amount varies with the removal technique, but is usually in the range of 30% to 80% of the total amount of solder used in the solder bonds. This amount of solder is excessive and must be removed before a replacement device can be joined. Generally only 10–15% of the total solder should remain on the pads in preparation for a subsequent device joining operation.

The solder removal operation is time consuming, tedious, and expensive. In addition, the operation can cause damage to adjacent devices and device bonds, and also to the substrate metallurgy itself.

There is a need for a device removal technique where the excess solder is conveniently removed along with the device, thereby leaving the terminal pad sites ready to accept another device without the need for a clean-up operation.

SUMMARY OF THE INVENTION

In accordance with the present invention we provide an apparatus for removing solder bonded devices from a substrate which is capable of leaving only the prerequisite solder necessary for a subsequent device joining operation. The apparatus of the invention is a hollow housing element having an open end with a seating portion adapted to engage the flat backside of a semiconductor device, an inlet for admitting heated gases to the interior of the housing, and an outlet for heated gases. A baffle is provided within the housing having an end portion recessed from the seating portion of the housing. The baffle is adapted to direct heated gases downwardly against the backside surface of the device in engagement with the seating portion of the housing and to subsequently direct the heated gases out of the outlet. A clamping means is also provided on the housing adjacent the open end to secure a semiconductor device in seated relation on the seating portion. A means is also provided to selectively activate the clamping means from a holding and releasing engagement with the device.

The rework method of our invention for removing a solder bonded semiconductor device from a ceramic substrate leaving only a coating of solder on the pad site sufficient to solder bond another device without the need for additional pad site preparation includes the steps of preheating the substrate with the solder bonded devices to a temperature not greater than 100° C. less than the melting point of the solder of the solder bonds, selectively directing a constrained stream of heated inert gas to the back surface of the device to quickly raise the temperature of the solder bonds above the melting point of the solder, removing the heated gas without allowing it to contact the substrate, lifting the device from the substrate before the heat applied by the heated gas significantly heats the top of the substrate above the preheated temperature. The rapid heating of the device combined with the timing of the lifting of the device produces a large temperature differential at the solder-pad interfaces that result in 80–90% of the solder material of the solder bonds to selectively adhere to the device.

BRIEF DESCRIPTION OF THE DRAWINGS

The details of our invention will be described in connection with the accompanying drawing in which.

BEST MODE FOR CARRYING OUT THE INVENTION

Figure 1:
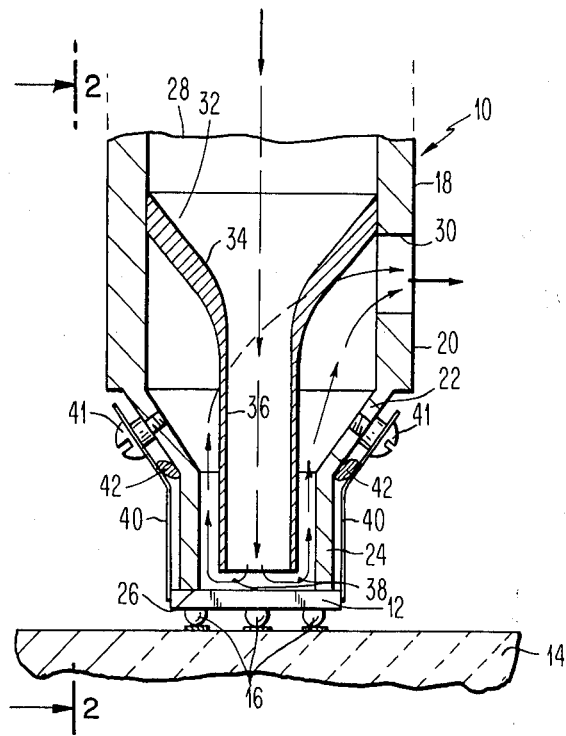
FIG. 1 is an elevational view in section illustrating the structure of the apparatus of the invention shown in position over a semiconductor device solder bonded to a substrate.
Figure 2:
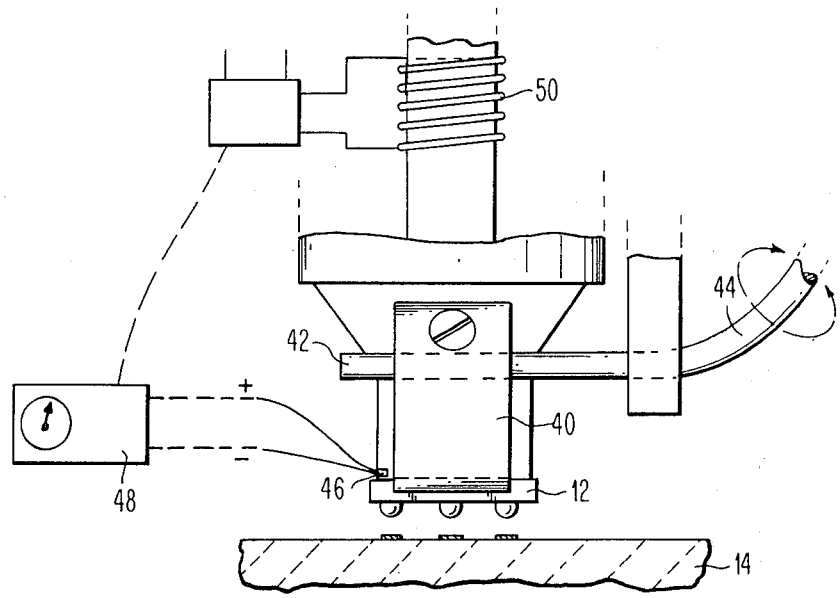
FIG. 2 is a side view of the lower end portion of the apparatus illustrated in FIG. 1 showing additional detail.

Referring now to the drawings and FIG. 1 in particular, there is shown the apparatus 10 for removing solder bonded devices 12 from a substrate 14. Solder bonds 16 join the device 12 to substrate 14 and are described and claimed in detail in U.S. Pat. No. 3,495,133. The apparatus 10 has a housing element 18 with an annular upper portion 20, a tapered intermediate portion 22, and a constricted lower portion 24. Portion 24 has an open end with a seating portion 26 adapted to engage the back side of device 12. Housing 18 has an inlet 28 for admitting heated gases to the interior of the housing, and an outlet 30 for exhausting heated gases. A baffle 32 is mounted within housing 18 which in use directs heated gases downwardly against the backside surface of device 12 and subsequently out of outlet 30. Baffle 32 has a tapered upper portion 34 that engages the inside surface of housing 18 i.e., the upper portion 20, and a tubular lower portion 36 having an end spaced from the seating portion 26 of the housing. This arrangement allows heated gases entering through outlet 28 to be directed across the back surface of the device 26 as indicated by the arrows 38. Device 12 is secured to the seating portion 26 of housing 18 by 2 opposed flat spring elements 40 having the upper ends secured to the housing with bolts 41, and the lower ends extending beyond the seating portion 26. The spring elements 40 are biased inwardly and contact the sides of device 12. The device is held in place by friction between the device and the ends of spring elements 40. A means to activate the clamping elements 40 from a remote location is provided. The clamping control consists of 2 camming elements 42 having an oblong cross section that are rotatably positioned between the spring elements 40 and the housing 18. Rotation of the camming elements by cables 44 as indicated in FIG. 2 cams the spring element 40 outwardly away from the edges of device 12. A thermo couple 46 is mounted in the lower portion of the housing 18 adjacent the seating portion 26 in order to provide a measure of the temperature of the device. Leads from the thermo couple are connected to a suitable indicator 48 for visually providing an indication of the device temperature. In addition, the output from thermo couple 46 can be used to control a resistance heater 50 that heats inert gas entering housing 18. Through inlet 28, the heated gas after being circulated over the back top surface of the device 12 is exhausted out of exit 30.

With the rework method for removing a solder bonded semiconductor devices from a ceramic substrate, utilizing the aforedescribed apparatus, 80–90% of the solder material forming the solder bond joininig the device to the substrate can be removed along with the device. The remaining solder is the proper amount to protect the pads from oxidation, and maintain wettability of the pads. By this method, conventional operations to remove excess solder as described in IBM TDB Oct. 1975 Vol. 18 No. 5 P. 1384 are not necessary. In the rework method of our invention, the substrate bearing the device to be removed is pre-heated to a temperature, in general, not greater than 100° C. less than the melting point of the solder of the solder bonds. This preheat temperature can vary with the type of solder used in the solder bonds and with other conditions for removing the device. In general, the preheat temperature ranges from 100°–220° C., more preferably from 180°–200° C. Subsequently, a stream of heated inert gas is directed to the back surface of the device to be removed to very quickly raise the temperature of the solder bonds above the melting point of the solder. This operation is preferably achieved utilizing the aforedescribed apparatus. The average temperature increase of the solder bonds during this heating stage is preferably in the range of 17°–20° C. per second. The stream of heated inert gas can be heated to any suitable temperature typically from 450°–500° C., in order to achieve the temperature rise required. In order to achieve a very rapid increase of temperature in the device, the apparatus used to constrain the stream of heated gas is preheated prior to its placement in engagement with the backside of the device. After the heating is achieved, the semiconductor device is quickly lifted from the substrate before the heat applied by the heated gas significantly heats the top of the substrate supporting the device above the pre-heated temperature. It is theorized that the large temperature differential between the solder in the solder bonds and the supporting substrate sets up the conditions whereby approximately 80–90% of the solder will preferentially adhere to the solder pads on the device rather than to the pads on the substrate. In general, the temperature of the solder material in the solder bond is heated to 40°–60° C. above the melting point temperature. The substrate and the solder pads thereon are not significantly heated above the original pre-heat temperature. The conditions for practicing the method of the invention must be carefully determined and controlled to set up the large temperature differential between the solder and the solder pads on the substrate in order to lift 80–90% of the material of the solder with the device as it is lifted from the device.

The following example is set forth to describe a preferred specific embodiment of the method of the invention and is not intended to unduly limit the claims of the invention:

EXAMPLE

An alumina multi-layer ceramic substrate, produced as described in U.S. Pat. No. 4,302,625, that measured 90×90 mm with 100 semiconductor devices bonded to the top surface was selected. Each of the semiconductor devices was bonded to the substrate with 121 solder bonds formed of 90% lead and 10% tin, having a melting point of 315° C. Each of the semiconductor devices were formed of silicon with a size of 180×180 mils. A defectively bonded or defective substrate was selected for removal by the method of the invention. The substrate was placed in an IR furnace for 10 minutes where the temperature was maintained at 190° C. The rework apparatus described previously was supported on a movable support and preheated by passing nitrogen gas heated at 500° C. When the temperature of the nozzle reached 350° C. the flow of the gas was terminated, the housing moved over the device selected for removal and clamped to the device. The circulation of the heated nitrogen gas was resumed and the temperature of the nozzle observed. At the end of 10 seconds the temperature of the nozzle reached 375° C. and the device was lifted from the substrate. After the substrate was allowed to cool down to room temperature, the content of the solder remaining on the pads was measured and found to constitute approximately 15% of the original amount of the solder used in bonding the device to the substrate.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. An apparatus for removing solder bonded integrated circuit semiconductor devices from a substrate leaving the solder pads on the substrate with only a thin solder layer in condition for replacement of the device comprising
   a hollow housing element having an open end with a seating portion adapted to engage the flat back side of a semiconductor device, an inlet for admitting heated gases to the interior of said housing, and an outlet for heated gases,
   a baffle within said housing having an annular upper portion in engagement with the inside surface of said hollow housing element below said inlet, and a lower portion of constricted size with a cross-sectional area less than the cross-sectional area of said housing element, and an end portion recessed from said seating portion of said housing, said baffle adapted in use to direct heated gases downwardly against the back side surface of a semiconductor device in engagement with said seating portion of said housing, outwardly from the center of said lower portion of said baffle and upwardly, and to subsequently direct the heated gases out said outlet, a clamping means on said housing adjacent said open end to secure a semiconductor device in a seated sealed relation on said seating portion, a means to selectively activate said clamping means from holding and releasing engagement with a device when seated on said seating portion.

2. The apparatus of claim 1 wherein said clamping means is comprised of opposed flat spring elements attached at the upper ends to said housing, the lower ends of said spring elements extending beyond said seating portion of said housing.

said means to activate said clamping means comprised of rotatable cam elements positioned between said housing and said spring elements.

3. The apparatus of claim 2 which further includes a thermocouple mounted on the lower portion of said housing.

4. The apparatus of claim 3 which further includes a heater means to heat gases prior to introduction into said inlet of said housing element, and a control for said heater means operatively connected to said thermocouple.

* * * * *